US012757362B2

(12) United States Patent
Kodama

(10) Patent No.: US 12,757,362 B2
(45) Date of Patent: Oct. 6, 2026

(54) COOLING SYSTEM

(71) Applicant: TOYOTA JIDOSHA KABUSHIKI KAISHA, Toyota (JP)

(72) Inventor: Yasuaki Kodama, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 268 days.

(21) Appl. No.: 18/630,123

(22) Filed: Apr. 9, 2024

(65) Prior Publication Data

US 2025/0107053 A1 Mar. 27, 2025

(30) Foreign Application Priority Data

Sep. 25, 2023 (JP) ................................ 2023-159354

(51) Int. Cl.
*H05K 7/20* (2006.01)

(52) U.S. Cl.
CPC ................................ *H05K 7/20927* (2013.01)

(58) Field of Classification Search
CPC ................................................ H05K 7/20927
USPC ........................................................ 361/699
See application file for complete search history.

(56) References Cited

U.S. PATENT DOCUMENTS 7,156,195 B2 * 1/2007 Yamagishi .......... F16H 57/0476
310/60 A
2003/0194522 A1 * 10/2003 Kurimoto ............ F16L 11/085
428/36.91
2018/0330906 A1 * 11/2018 Hiramitsu .......... H05K 7/20272
2021/0130672 A1 * 5/2021 Kodama .................. C09K 5/10
2022/0141999 A1 * 5/2022 Ge ..................... H05K 7/20254
361/679.47
2022/0386515 A1 * 12/2022 Smith ................ H05K 7/20854

FOREIGN PATENT DOCUMENTS

JP 2011-146320 A 7/2011
JP 2011-201953 A 10/2011
JP 2011-252100 A 12/2011
JP 2012-210022 A 10/2012
JP 2016-190953 A 11/2016
JP 2017-091801 A 5/2017
JP 2021-068838 A 4/2021
WO WO-2023074686 A1 * 5/2023 ................ F25B 1/00

* cited by examiner

*Primary Examiner* — Zhengfu J Feng
(74) *Attorney, Agent, or Firm* — SoraIP, Inc.

(57) ABSTRACT

Cooling system for cooling a heat-generating equipment in an electrified vehicle. The cooling system includes a coolant, a channel of the coolant, and a pump for circulating the coolant in the channel, wherein the channel includes a portion including nitrile rubber in a channel wall, the coolant includes 95% by mass or more of mineral oil, and an aniline point of the coolant is 80° C. to 105° C.

4 Claims, 1 Drawing Sheet

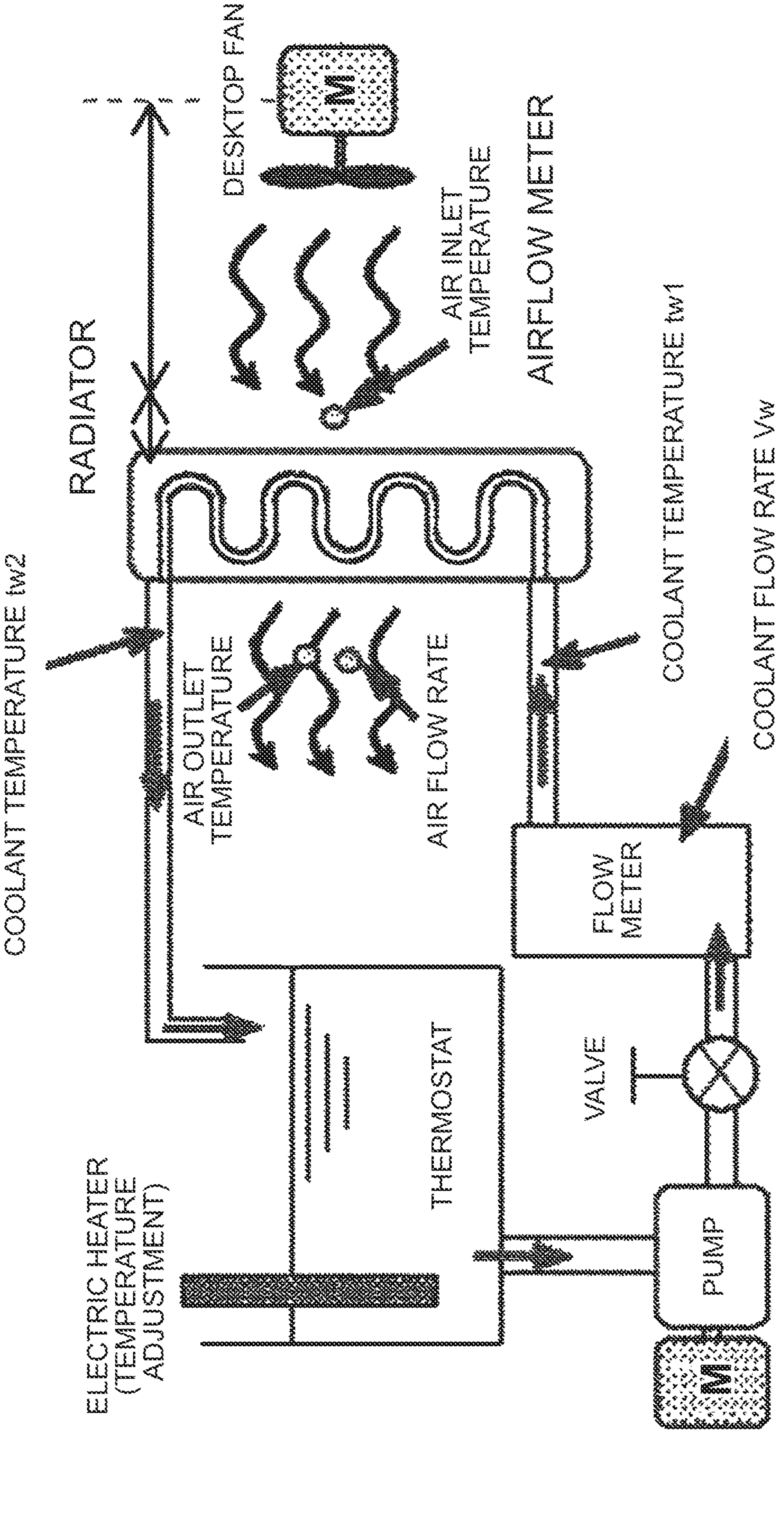
DESKTOP FAN
M
RADIATOR
AIR INLET TEMPERATURE
AIRFLOW METER
COOLANT TEMPERATURE tw2
AIR OUTLET TEMPERATURE
AIR FLOW RATE
COOLANT TEMPERATURE tw1
COOLANT FLOW RATE Vw
FLOW METER
THERMOSTAT
VALVE
ELECTRIC HEATER (TEMPERATURE ADJUSTMENT)
PUMP
M

COOLING SYSTEM

CROSS-REFERENCE TO RELATED APPLICATION

This application claims priority to Japanese Patent Application No. 2023-159354 filed on Sep. 25, 2023, incorporated herein by reference in its entirety.

BACKGROUND OF THE INVENTION

1. Field of the Invention

The present disclosure relates to a cooling system.

2. Description of Related Art

Various types of technology have been proposed regrading cooling systems, such as disclosed in:

Japanese Unexamined Patent Application Publication No. 2011-146320 (JP 2011-146320 A);

Japanese Unexamined Patent Application Publication No. 2021-068838 (JP 2021-068838 A);

Japanese Unexamined Patent Application Publication No. 2017-091801 (JP 2017-091801 A);

Japanese Unexamined Patent Application Publication No. 2016-190953 (JP 2016-190953 A); and Japanese Unexamined Patent Application Publication No. 2011-252100 (JP 2011-252100 A).

SUMMARY OF THE INVENTION

Coolant in a cooling system for a secondary battery (battery) is required to have insulating properties. In electrified vehicles, regarding which cost competition is fierce, cost reduction of cooling systems is demanded as well. Further, in electrified vehicles in which heat-generating equipment (secondary batteries, inverters, converters, generators, motors, and so forth) is installed at high density, there is demand for a cooling system that allows efficient cooling, even when channels for the coolant are narrowed (cross-sectional area is reduced). Achieving both cooling properties and compatibility with low-cost nitrile rubber has been difficult with coolants according to the related art.

The present disclosure provides a cooling system that is low in costs and high in cooling efficiency.

That is to say, the present disclosure includes the following aspects. A cooling system for cooling heat-generating equipment in an electrified vehicle includes coolant, a channel for the coolant, and a pump for circulating the coolant in the channel, the channel includes a portion containing nitrile rubber in a channel wall, and the coolant contains 95% by mass or more of mineral oil, and an aniline point of the coolant is from 80° C. to 105° C.

Kinematic viscosity of the coolant at 40° C. may be no greater than 5 $mm^2/s$.

The heat-generating equipment may be at least one type selected from a group consisting of an inverter, a converter, a generator, a motor, and a battery.

The coolant may include an additive that is at least one type selected from a group consisting of an antifoaming agent, an antioxidant, a rust inhibitor, a pour point depressant, a dispersant, a surfactant, and a flow antistatic agent.

The cooling system according to the present disclosure is inexpensive and has high cooling efficiency.

BRIEF DESCRIPTION OF THE DRAWINGS

Features, advantages, and technical and industrial significance of exemplary embodiments of the invention will be described below with reference to the accompanying drawings, in which like signs denote like elements, and wherein:

FIG. 1 is a schematic diagram of a testing machine used for evaluation of cooling performance of a coolant.

DETAILED DESCRIPTION OF EMBODIMENTS

Hereinafter, embodiments according to the present disclosure will be described. It should be noted that matters other than those specifically mentioned in the present specification and necessary for the implementation of the present disclosure (for example, a general configuration of a cooling system that does not characterize the present disclosure and a manufacturing process) can be understood as design matters of a person skilled in the art based on the prior art in the field. The present disclosure can be carried out based on content disclosed in the present specification and common knowledge in the technical field.

In addition, the dimensional relationship (length, width, thickness, and the like) in the drawings does not reflect the actual dimensional relationship.

The present disclosure relates to a cooling system for cooling a heat-generating equipment in an electrified vehicle.

The cooling system includes a coolant, a channel for the coolant, and a pump for circulating the coolant in the channel.

The channel includes a portion including nitrile rubber in a channel wall.

The coolant contains 95% by mass or more of mineral oil, and the aniline point of the coolant is from 80° C. to 105° C.

Conventionally, the cooling component side has an insulating structure, and an aqueous coolant having a low insulating property has been used as the coolant. However, when the insulating structure is added to the cooling component side, a material having poor heat transfer is sandwiched between the portion to be cooled and the coolant.

Commonly used water-based coolant (ethylene glycol-based) has low insulation properties. On the other hand, it is necessary to consider compatibility with rubber materials used for hoses and the like for mineral oil having excellent insulating properties.

As a determination index of the rubber compatibility, an aniline point is cited as a general item. When the aniline point is low, the effect of swelling the rubber is generally large, and therefore, it is necessary to pay attention to liquid leakage and the like. In addition, if the aniline point is too high, the rubber shrinks, and there is also a possibility of liquid leakage. Conventionally, in the application case of a lubricating oil, an acrylic rubber having a relatively high use temperature and heat resistance is used. Therefore, the aniline point is defined for rubber compatibility=acrylic rubber compatibility.

On the other hand, the present disclosure is limited to cooling applications such as batteries in electrified vehicle, and uses are lower than in the past. Therefore, although it has heat resistance such as acrylic rubber, it is difficult to apply a rubber having high cost and low oil resistance, and it is premised on the application of a nitrile rubber having higher oil resistance and low cost. Different rubber species vary the optimum aniline point on the corresponding oil side. Thus, aniline points suitable for nitrile rubbers are defined in the present disclosure.

The present disclosure provides a coolant compatible with nitrile rubber upon application of a highly insulative coolant (non-aqueous system) for electrified vehicle heat-generating equipment. The heat-generating equipment includes a battery, an inverter, a converter, a generator, a motor, a radiator, an oil cooler, and the like.

The cooling system of the present disclosure includes a coolant that can ensure airtightness of a pipe even when a low-cost nitrile rubber is used for the coolant pipe, and has a small pressure loss even when the channel of the coolant is small in diameter.

By providing the coolant of the present disclosure, the swellability can be controlled even when the nitrile rubber is used for the channel piping, and as a result, the airtightness of the channel piping can be ensured. At the same time, the kinematic viscosity of the coolant can be reduced, and the pressure loss can be reduced even in a cooling system in which the heat-generating equipment is densified and the cross-sectional area of the coolant channel is small. As a result, a low-cost and high-cooling-efficiency cooling system can be obtained.

The disclosed cooling system cools heat-generating equipment in an electrified vehicle.

Electrified vehicle is a vehicle that travels by driving a motor.

Electrified vehicle includes a cooling system, heat-generating equipment, and the like.

Examples of the heat-generating equipment include an inverter, a converter, a generator, a motor, a battery, a radiator, and an oil cooler. Among them, the heat-generating equipment may be an inverter, a converter, a generator, a motor, a battery, or the like. The heat-generating equipment may comprise a power card. The power card may be in physical contact with the coolant.

The type of the battery (secondary battery) is not particularly limited, and examples thereof include a nickel-hydrogen secondary battery and a lithium-ion secondary battery. The secondary battery may be a liquid-based secondary battery using an electrolyte solution as an electrolyte, or a solid secondary battery using a solid electrolyte as an electrolyte.

The cooling system includes a coolant, a channel for the coolant, and a pump for circulating the coolant in the channel.

The channel may be provided with a portion containing nitrile rubber in the channel wall. The channel may be made of nitrile rubber.

The coolant contains 95% by mass or more of mineral oil, and the aniline point of the coolant is from 80° C. to 105° C.

The kinematic viscosity of the coolant at 40° C. may be less than or equal to 5 $mm^2/s$. The coolant may comprise an additive.

Examples of the additive include an antifoaming agent, an antioxidant, a rust inhibitor, a pour point depressant, a dispersant, a surfactant, and a flow antistatic agent. The additive may include one or two or more of these.

The coolant may contain 95% by mass or more of mineral oil, and may contain 97% by mass or more of mineral oil.

The coolant may comprise up to 5% by mass of additive and up to 3% by mass of additive.

The mineral oil may comprise a first hydrocarbon and a second hydrocarbon. The first hydrocarbon includes at least one of a naphthenic hydrocarbon and an aromatic hydrocarbon. The second hydrocarbon includes at least one of a paraffinic hydrocarbon and an olefinic hydrocarbon.

The blending ratio of the second hydrocarbon may be higher than that of the first hydrocarbon. In order to improve nitrile rubber compatibility, the proportion of naphthenic and aromatic hydrocarbons that swell the rubber can be reduced and the proportion of paraffinic and olefinic hydrocarbons can be increased to adjust the aniline point from 80° C. to 105° C.

The parameters in the examples were measured and calculated in the following manner.

Aniline Point

The aniline was placed in a beaker and the same amount of measurement sample as the aniline was placed. At this time, it was adjusted so that the aniline: measurement sample=5:5. The solution in which the aniline and the measurement sample were mixed was cooled, and the temperature at the time of separation was taken as the aniline point.

Rubber Compatibility

A sheet of nitrile rubber piece was immersed in the measurement sample at 100° C. for 200 hours. The rubber volume swell rate after the test was measured according to JIS Standard (K6258).

Kinematic Viscosity at 40° C.

An Ubbelohde viscometer was placed in a bath controlled at 40° C., and the kinematic viscosity of the measured sample was measured according to JIS Standard (Z8803).

Flash Point

Flash point was measured by the Penski-Martens sealing method according to JIS Standard (K2265-3:2007).

Pour Point

The pour point was measured according to JIS Standard (K2269).

Cooling Performance

FIG. 1 is a schematic diagram of a testing machine used for evaluation of cooling performance of a coolant.

The cooling performance Qw (W/K) of the measured sample was measured using the testing machine shown in FIG. 1 according to the following equation and the following evaluation conditions.

Evaluation Conditions

Air volume of desk fan: 4.5 m/sec

Temperature difference: 40° C. (outside air: 25° C., coolant: 65° C.)

Vw: Coolant flow rate (10 L/min)

γw: Density of coolant

Cpw: Specific heat of coolant $tw_1$: Coolant upstream of the radiator $tw_2$: Coolant flow down the radiator $$Q_W = \frac{V_W \cdot \gamma_W \times 10^{-3}}{60} \cdot C_{pW} \cdot (t_{W1} - t_{W2}) \quad \text{(Mathematical formula 1)}$$

Examples 1 to 3 and Comparative Examples 1 to 5

A coolant containing the components shown in Table 1 was prepared and the performance of each coolant was evaluated. Table 1 shows the result;

Table 2 also shows the physical properties of mineral oils 1 to 6 in Table 1.

TABLE 1

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Coolant Component [% by mass] | Mineral oil 1 | 97 | | | | | | | |
| | Mineral oil 2 | | 97 | | | | | | |
| | Mineral oil 3 | | | 97 | | | | | |
| | Mineral oil 4 | | | | 97 | | | | |
| | Mineral oil 5 | | | | | 97 | | | |
| | Mineral oil 6 | | | | | | 97 | 97 | |
| | Ethyl octanoate | | | | | | | | 100 |
| | Additive 1 | 3 | 3 | 3 | 3 | 3 | 3 | 2 | |
| | Additive 2 | | | | | | | 1 | |
| Aniline point [° C.] | 80 to 105 are preferred | 80 | 90 | 105 | 76 | 76 | 112 | 112 | — |
| Rubber compatibility | Nitrile rubber swelling [%] Preferably from 0 to +10 | 10 | 6 | 1 | 12 | 12 | −1 | −1 | 60 |
| Pour point [° C.] | ≤−30° C. is preferred | <−35 | <−35 | <−35 | <−35 | <−35 | −25 | −30 | — |
| Flash point [° C.] | ≥100° C. is preferred | 100 | 110 | 120 | 95 | 100 | 120 | 120 | — |
| 40° C. kinematic viscosity [$mm^2/s$] | ≤5 is preferred | 5 | 5 | 5 | 5 | 6 | 5 | 6 | 1 |
| Cooling performance [W/K] | ≥190 W/K is preferred | 190 | 190 | 190 | 190 | 185 | 190 | 185 | 230 |

TABLE 2

| | Base oil | | | | | |
|---|---|---|---|---|---|---|
| | Mineral oil 1 | Mineral oil 2 | Mineral oil 3 | Mineral oil 4 | Mineral oil 5 | Mineral oil 6 |
| 40° C. kinematic viscosity [$mm^2/s$] | 5 | 5 | 5 | 5 | 6 | 6 |
| Pour point [° C.] | <−35 | <−35 | <−35 | <−35 | −25 | −25 |
| Aniline point [° C.] | 80 | 90 | 105 | 76 | 76 | 112 |
| Average number of carbon atoms | 11 | 12 | 13 | 10 | 16 | 17 |

In Comparative Example 5, a base having a polarity such as ethyl octanoate found in the prior art is applied. In Comparative Example 5, there is no compatibility of the nitrile rubber.

Further, as shown in Comparative Examples 1 to 4, when the aniline point falls outside the specified range of the present disclosure, the suitability of the nitrile rubber tends to deviate from a preferable numerical value.

On the other hand, as shown in Examples 1 to 3, if the aniline point falls within the specified range of the present disclosure, the suitability of the nitrile rubber falls within a preferable numerical range, and the desired cooling performance is ensured.

What is claimed is:

1. A cooling system for cooling heat-generating equipment in an electrified vehicle, the cooling system comprising:

a coolant;

a channel for the coolant; and a pump for circulating the coolant in the channel, wherein the channel includes a portion containing nitrile rubber in a channel wall, the coolant contains 95% by mass or more of mineral oil, an aniline point of the coolant is from 80° C. to 105° C., the mineral oil includes a first hydrocarbon and a second hydrocarbon, the first hydrocarbon includes at least one of a naphthenic hydrocarbon and an aromatic hydrocarbon, the second hydrocarbon includes at least one of a paraffinic hydrocarbon and an olefinic hydrocarbon, a blending ratio of the second hydrocarbon is higher than a blending ratio of the first hydrocarbon, the coolant includes an additive, and the additive is at least one type selected from a group consisting of an antifoaming agent, an antioxidant, a rust inhibitor, a pour point depressant, a dispersant, a surfactant, and a flow antistatic agent.

2. The cooling system according to claim 1, wherein kinematic viscosity of the coolant at 40° C. is no greater than 5 $mm^2/s$.

3. The cooling system according to claim 1, wherein the heat-generating equipment is at least one type selected from a group consisting of an inverter, a converter, a generator, a motor, and a battery.

4. The cooling system according to claim 1, wherein the coolant contains 97% by mass or more of the mineral oil.

* * * * *